United States Patent [19]

Katsuno

[11] Patent Number: 5,355,335
[45] Date of Patent: Oct. 11, 1994

[54] SEMICONDUCTOR MEMORY DEVICE HAVING A PLURALITY OF WRITING AND READING PORTS FOR DECREASING HARDWARE AMOUNT

[75] Inventor: Akira Katsuno, Kawasaki, Japan

[73] Assignee: Fujitsu Limited, Kawasaki, Japan

[21] Appl. No.: 903,518

[22] Filed: Jun. 24, 1992

[30] Foreign Application Priority Data

Jun. 25, 1991 [JP] Japan ................. 3-153491

[51] Int. Cl.⁵ .............................. G11C 7/00
[52] U.S. Cl. .................... 365/189.04; 365/189.05; 365/230.05; 365/189.01; 365/189.12
[58] Field of Search ............... 365/189.04, 189.05, 365/189.12, 230.05, 230.01, 189.01

[56] References Cited

U.S. PATENT DOCUMENTS

| | | | |
|---|---|---|---|
| 4,769,789 | 9/1988 | Noguchi et al. | 365/189.12 |
| 4,893,280 | 1/1990 | Gelsomini et al. | 365/230.5 |
| 5,029,134 | 7/1991 | Watanabe | 365/189.05 |
| 5,170,157 | 12/1992 | Ishii | 365/189.05 |

FOREIGN PATENT DOCUMENTS

| | | |
|---|---|---|
| 0011375 | 5/1980 | European Pat. Off. . |
| 55-70982 | 5/1980 | Japan . |
| 63-308784 | 12/1988 | Japan . |
| 1-296485 | 11/1989 | Japan . |

*Primary Examiner*—Viet Q. Nguyen
*Attorney, Agent, or Firm*—Staas & Halsey

[57] ABSTRACT

A semiconductor memory device, that has a plurality of writing ports and reading ports comprises a first data latch portion, at least one second data latch portions, and communication units. The first data latch portion is directly accessible by externally entering an address signal, and the second data latch portions are parallel connected to the first data latch portion. The communication units is used to access one of the first and second data latch portions. Therefore, according to the semiconductor memory device of the present invention, the amount of hardware of a register file of the processor employing parallel processing and local register architecture can be significantly reduced by providing the first data latch portion and at least one or more of the second data latch portions having communication units and accessing one of the first and second data latch portions.

23 Claims, 12 Drawing Sheets

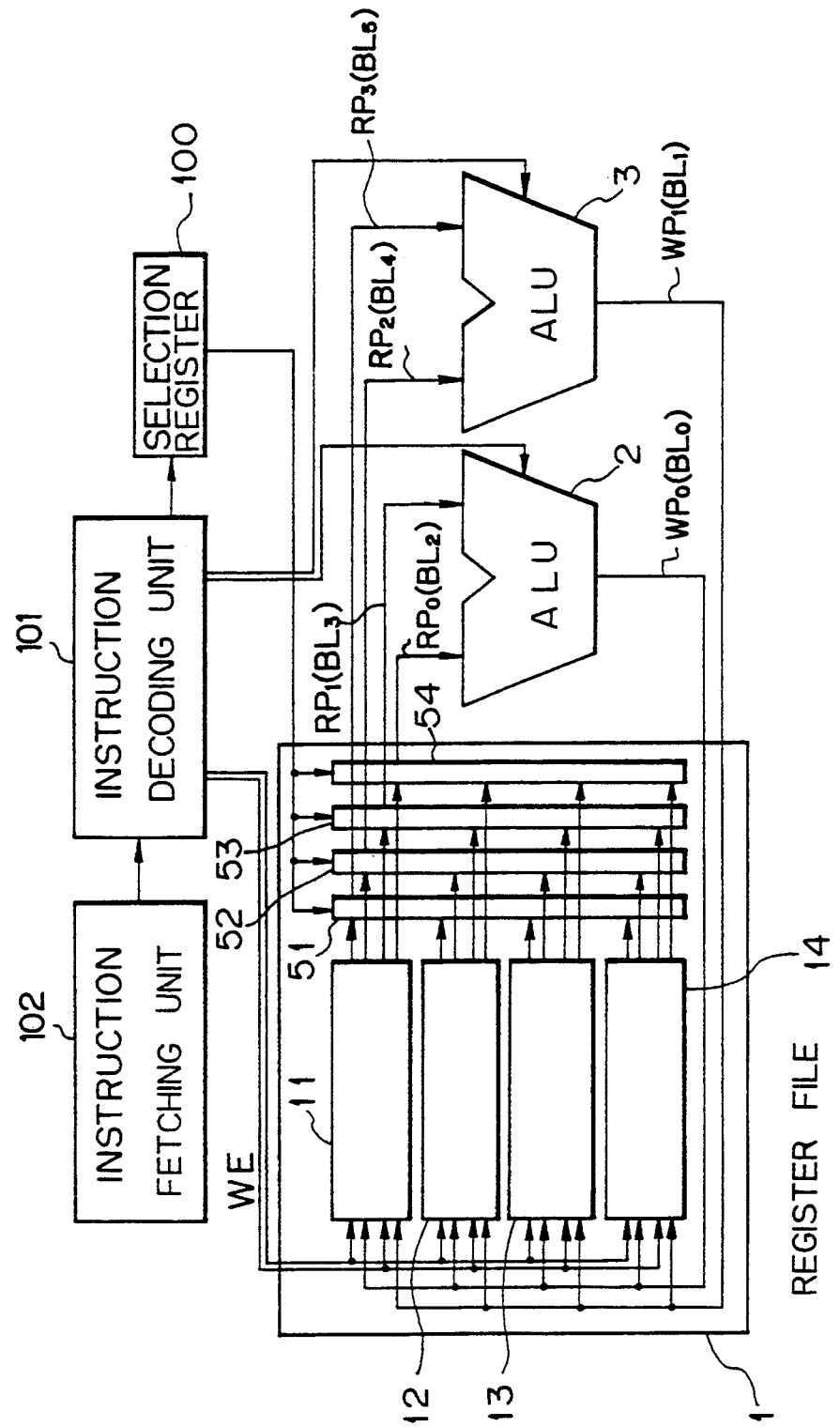

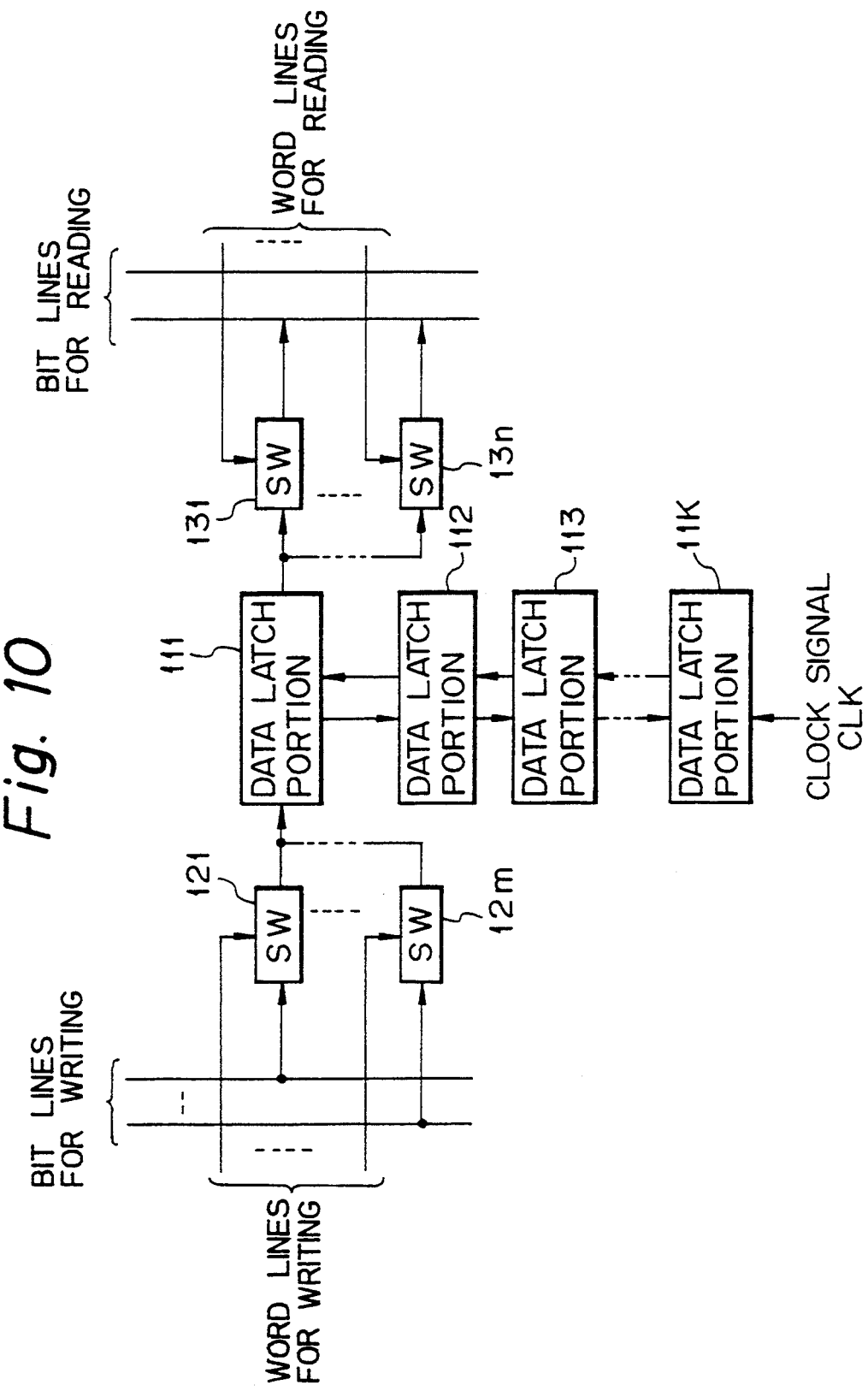

SEMICONDUCTOR MEMORY DEVICE HAVING A PLURALITY OF WRITING AND READING PORTS FOR DECREASING HARDWARE AMOUNT

BACKGROUND OF THE INVENTION

1. Field of the Invention

The present invention relates to a semiconductor memory device and, more particularly, to a semiconductor memory device having a plurality of writing ports and reading ports.

2. Description of the Related Art

Recently, microprocessors (i.e. arithmetic processing devices, or processors) generally comprise an instruction fetching unit, instruction decoding unit, arithmetic operation executing unit, register file, and the like. Further, these microprocessors have been, for example, designed to execute instructions by pipeline operation.

The conventional microprocessor includes only one arithmetic operation executing unit, and thus the register file comprises a semiconductor memory device (for example, SRAM) having two-read/one-write ports. Such semiconductor memory devices having two-read/one-write ports can effectively carry out three address type arithmetic operations, such as adding instructions.

The microprocessors tend to employ parallel processing architecture, such as VLIW (Very Long Instruction Word) or Superscaler, and the like, to enable higher speed processing. Microprocessors employing such types of architecture include a plurality of arithmetic operation executing units and semiconductor memory devices having a plurality of read/write ports for performing a transfer of data between a plurality of arithmetic operation executing units and semiconductor memory devices (register file).

In general, for n (i.e. number of) arithmetic operation execution units, 2 n reading ports and n writing ports are necessary for the semiconductor memory devices. Note, in order to execute a sub-routine call or so forth, an architecture of a microprocessor having a plurality of local register files has been known. However, such an architecture requires a large number of local register files, since it assigns a specific local register file for each sub-routine. Such a register file is, for example, formed by employing a plurality of two-read ports/one-write port semiconductor memory devices.

On the other hand, in accordance with the progress of semiconductor technology, data processing devices capable of high speed performance have been developed and arithmetic processing devices (microprocessors) that are capable of performing parallel arithmetic operations have been provided. Accordingly, semiconductor memory devices (for example, multi-port SRAM) having a plurality of writing ports and reading ports have been developed. However, these semiconductor memory devices have a large amount of hardware, and they are expensive.

SUMMARY OF THE INVENTION

An object of the present invention is to provide a semiconductor memory device having a plurality of both writing ports and reading ports implemented with a small amount of hardware and which are inexpensive.

According to the present invention, there is provided a semiconductor memory device having a plurality of writing ports and reading ports for carrying out parallel writing and reading operations respectively through the writing ports and the reading ports, wherein the semiconductor memory device comprises: a first data latch portion directly accessible by externally entering an address signal; at least one second data latch portion, connected in parallel to the first data latch portion; and a communication unit for accessing one of the first and second data latch portions.

The writing ports may be operatively connected to the first and second data latch portions through writing control transfer gates, and the reading ports may be operatively connected to the first and second data latch portions through reading control transfer gates. The communication unit may comprise a plurality of data latch portion selecting transfer gates provided at a respective writing side and reading side relative to the first and second data latch portions parallel connected, for selecting one of the first and second data latch portions in accordance with a selection signal.

The selection signal may be dependently generated by using a selection register, or it may be generated by using a selection signal decoder receiving a part of the address signal.

The writing data may be transferred from the writing ports to one of the first and second data latch portions through a plurality of bit lines for writing, and reading data may be transferred from one of the first and second data latch portions to reading ports through a plurality of bit lines for reading. The connection between the bit lines for writing and the first and second data latch portions may be controlled by a plurality of writing port selection gates, and the connection between the first and second data latch portions and the bit lines for reading may be controlled by a plurality of reading port selection gates.

The writing ports may be operatively connected to the first data latch portion through writing control transfer gates, and the reading ports may be operatively connected to the first data latch portion through reading control transfer gates. The communication unit may comprise a plurality of shifting control transfer gates for shifting data of one of the second data latch portions to the first data latch portion and for accessing one of the first and second data latch portions in accordance with a control signal. The control signal may be determined to an externally supplied clock signal.

The writing data may be written from the writing ports into the first data latch portion through a plurality of bit lines for writing, reading data may be read out from the first latch portion to reading ports through a plurality of bit lines for reading, and the data stored in the first data latch portion may be shifted to the second data latch portions. The connection between the bit lines for writing and the first data latch portions may be controlled by a plurality of writing port selection gates, and the connection between the first data latch portions and the bit lines for reading may be controlled by a plurality of reading port selection gates.

Further, according to the present invention, there is also provided an arithmetic processing device formed by one chip configuration having an instruction fetching unit for fetching an instruction, an instruction decoding unit for decoding the instruction fetched in the instruction fetching unit, a plurality of arithmetic operation executing units for carrying out arithmetic operations in parallel, and a register file for storing data having a plurality of writing ports and reading ports to carry out writing and reading operations in parallel through the writing ports and the reading ports, wherein the register file comprises: a first data latch portion directly accessible by externally entering an address signal; at least one second data latch portions parallel connecting to the first data latch portion; and a communication unit for accessing one of the first and second data latch portions.

BRIEF DESCRIPTION OF THE DRAWINGS

The present invention will be more clearly understood from the description of the preferred embodiments as set forth below with reference to the accompanying drawings, wherein:

FIG. 9 is a block diagram showing an example of a major part of a microprocessor, employing two arithmetic operation execution units, and the semiconductor memory device according to the present invention;

FIG. 10 is a block diagram showing another embodiment of the semiconductor memory device according to the present invention.

DESCRIPTION OF THE PREFERRED EMBODIMENTS

For a better understanding of the preferred embodiments, the problems of the related art will be explained, with reference to FIGS. 1A, 1B and 2.

Figure 1A:
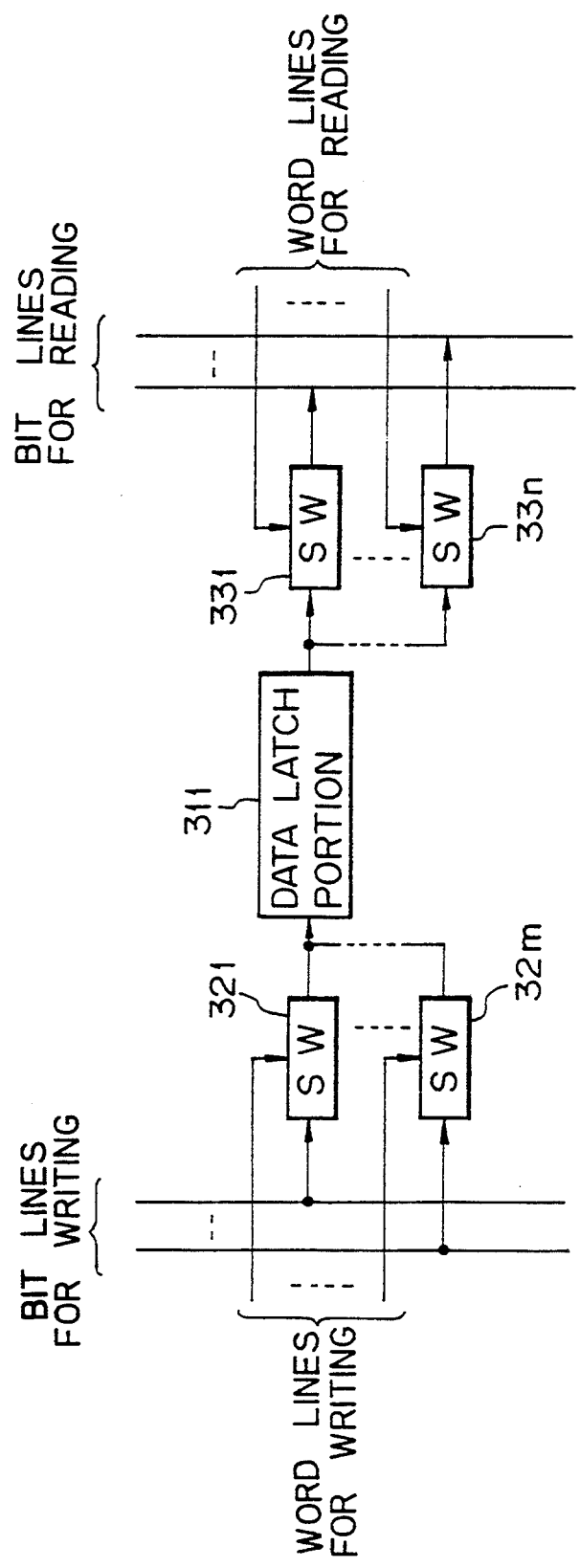
FIGS. 1A and 1B are block diagrams showing an example of a semiconductor memory device according to the prior art.
Figure 1B:
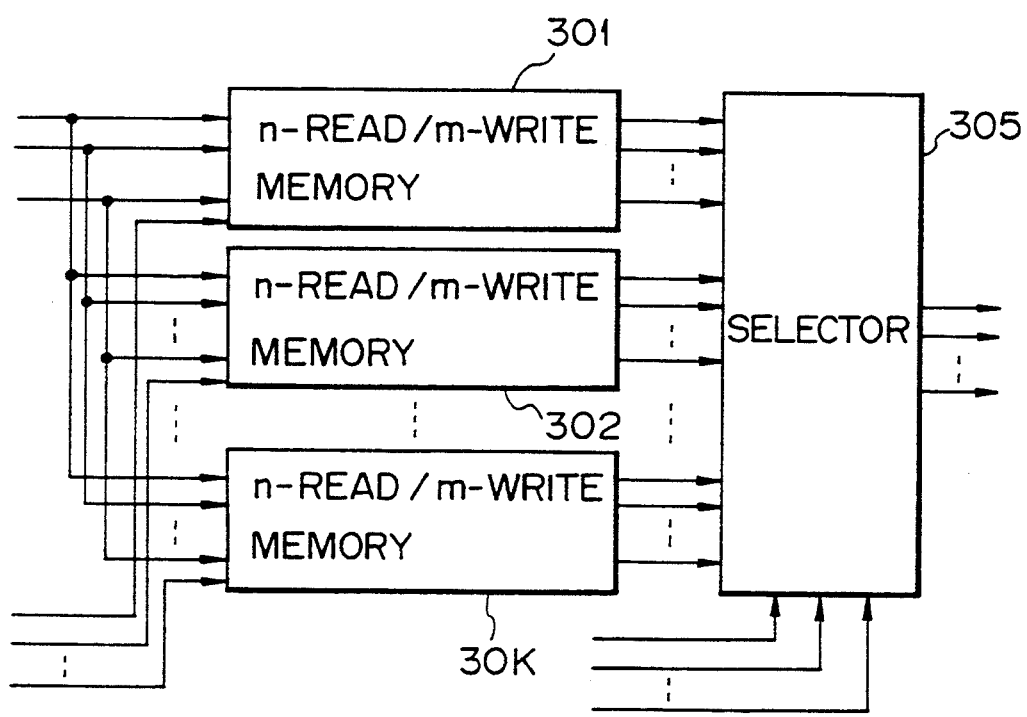

FIGS. 1A and 1B show an example of a semiconductor memory device according to the prior art.

The conventional semiconductor memory device having a plurality of read/write ports (n-read/m-write ports) is provided with m write selection switch ("SW") units (writing port selection gates) 321 to 32$m$, and n read selection switch units (reading port selection gates) 331 to 33$n$ for one data latch portion (memory cell) 311. Note, as shown in FIG. 1A, each of the writing port selection gates 321 to 32$m$ is provided for an intersectional portion (i.e., at the intersection) between a respective one of the bit lines for writing (writing bit lines) and each of the word lines for writing (writing word lines). Similarly, each of the reading port selection gates 331 to 33$n$ is provided for an intersectional portion (i.e., at the intersection) between a respective one of the bit lines for reading (reading bit lines) and a respective one of the word lines for reading (reading word lines). Therefore, the number of the writing bit lines and writing word lines is the same as the number (m) as the writing port selection gates 321 to 32$m$, and the number of the reading bit lines and reading word lines is the same as the number (n) of the reading port selection gates 331 to 33$n$.

As shown in FIG. 1B, the register file has k memory devices (n-read/m-write memories) 301 to 30$k$ and which are designed to be selected individually by a selector 305. The register file of the microprocessor (i.e., arithmetic processing devices, or processors) employing conventional parallel processing architecture and local register type (the number of local registers is generally referred to as k) is constituted by k n-read/m-write memories each memory having m writing ports and n reading ports.

Figure 2:
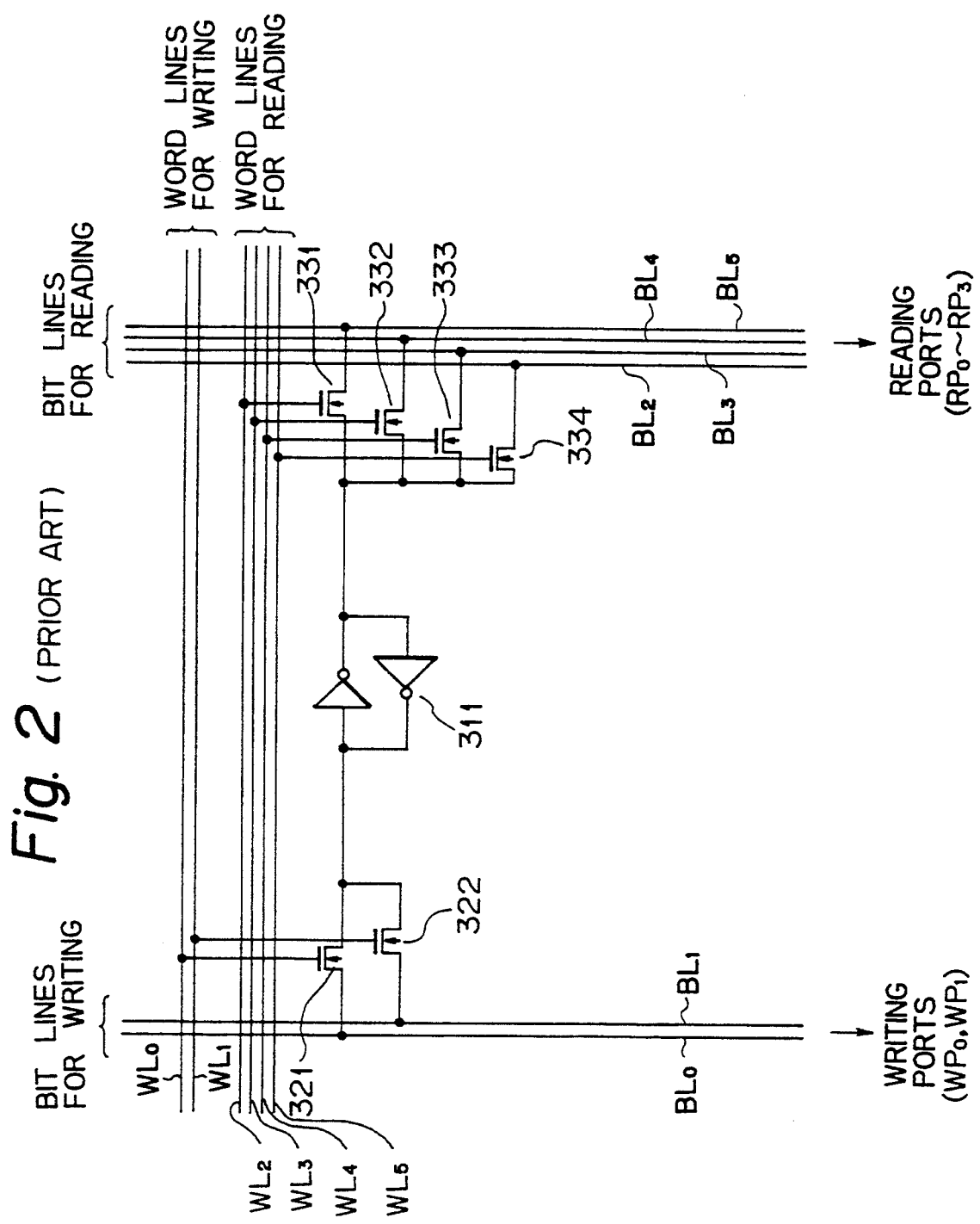
FIG. 2 is a circuit diagram showing a part of a SRAM having four-read/two-write ports and to which the semiconductor memory device of FIGS. 1A and 1B is applied.

FIG. 2 shows a part of a SRAM having four-read/two-write ports to which the semiconductor memory device of FIGS. 1A and 1B is applied. In FIG. 2, references $BL_0$ and $BL_1$ denote bit lines for writing (writing bit lines), $WL_0$ and $WL_1$ denote word lines for writing (writing word lines), $BL_2$ to $BL_5$ denote bit lines for reading (reading bit lines), and $WL_2$ to $WL_5$ denote word lines for reading (reading word lines).

As shown in FIG. 2, the SRAM having four-read/two-write ports has the construction in which two writing port selection gates 321 and 322 and four reading port selection gates 331 to 334 are provided for each SRAM cell 311. Further, each of the writing port selection gates 321 and 322 is provided for an intersectional portion (i.e., at the intersection) between a respective one of the writing bit lines $BL_0$ and $BL_1$ and a respective one of the writing word lines $WL_0$ and $WL_1$. Similarly, each of the reading port selection gates 331 to 334 is provided for an intersectional portion (i.e., at the intersection) between a respective one of the reading bit lines $BL_2$ to $BL_5$ and a respective one of the reading word lines $WL_2$ to $WL_5$.

Note, the two writing ports ($WP_0$, $WP_1$) are operatively connected to the respective writing bit lines $BL_0$ and $BL_1$ through a sense amplifier, and the like, to write data into each of the SRAM cells 311. Similarly, the four reading ports ($RP_0$, $RP_1$, $RP_2$, $RP_3$) are operatively connected to the respective reading bit lines $BL_2$ to $BL_5$ through a sense amplifier, and the like, to read out data from each of the SRAM cells 311. Further, in a microprocessor including the semiconductor memory device, the writing ports $WP_0$, $WP_1$ and reading ports $RP_0$ to $RP_3$ do not comprise external ports of the microprocessor, but are connected to arithmetic operation executing units (for example, ALUs: Arithmetic and Logic Units) provided in the microprocessor thereby to transfer data internally between the arithmetic operation executing units and the semiconductor memory device (register file).

As described above, the conventional semiconductor memory device having a plurality of read/write ports as illustrated in FIG. 1A and 1B comprise k of local registers (n-read/m-write memories) having m writing ports and n reading ports and thus requires the hardware amount of ((n-read/m-write memories)×k+selector). Accordingly, this structure makes the multi-port semiconductor memory devices, or the microprocessors having such microprocessors, expensive.

Namely, as shown in FIG. 2, in a SRAM having conventional four-read/two-write ports, two writing ports $WP_0$, $WP_1$ (writing bit lines $BL_0$, $BL_1$) are connected to the SRAM cell 311 (one memory cell) through two writing port selection gates 321 and 322, and four reading ports $RP_0$ to $RP_3$ (reading bit lines $BL_2$ to $BL_5$) are connected to the SRAM cell 311 through four reading port selection gates 331 to 334. Accordingly, in this case, six transistors (transfer gates 321, 322; 331, 332, 333, 334) becomes necessary for one memory cell (SRAM cell 311). Consequently, the hardware amount required for a large number of memory cells (311) becomes substantial.

Below, the preferred embodiments of a semiconductor memory device according to the present invention will be explained, with reference to the accompanying drawings.

Figure 3:
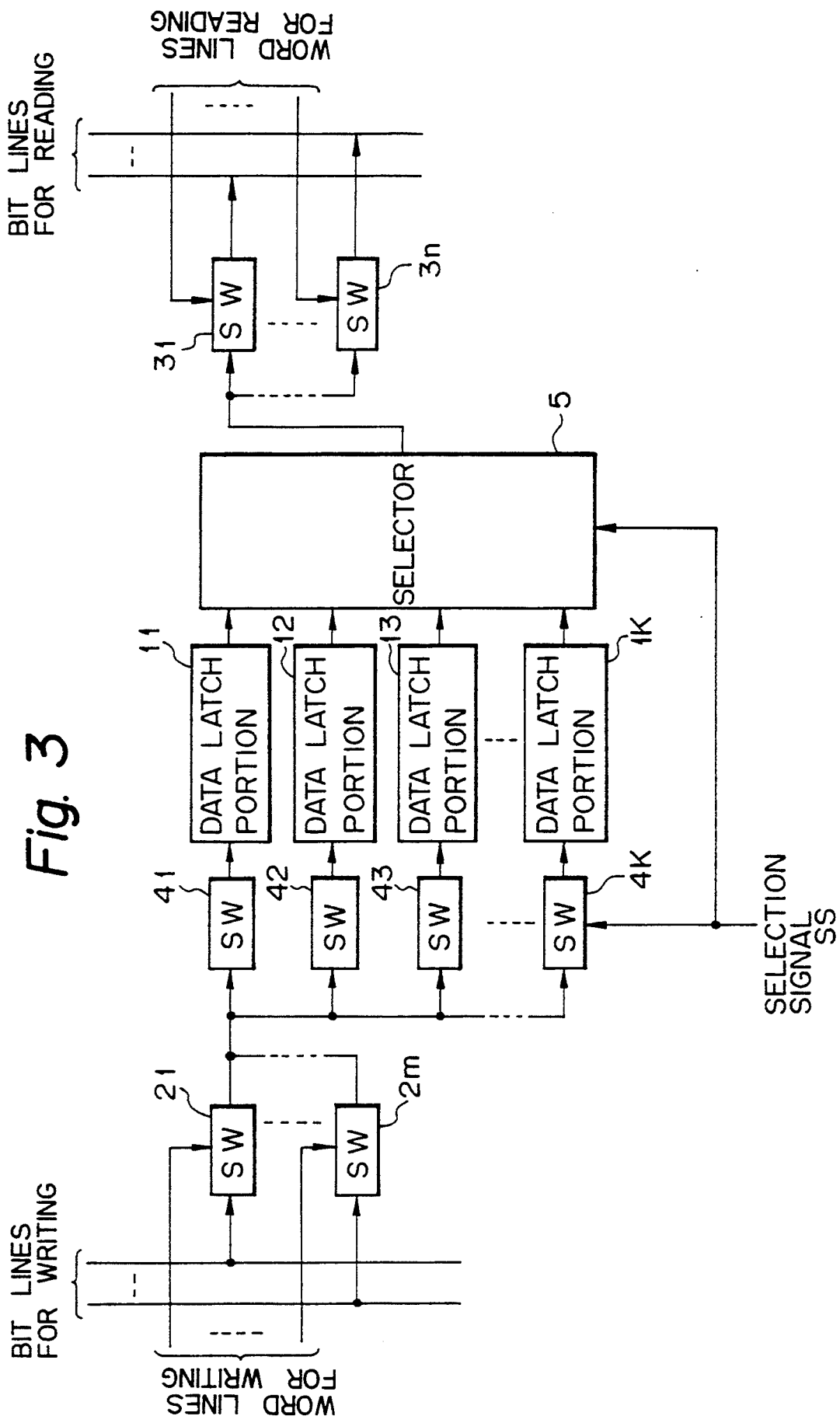
FIG. 3 is a block diagram showing an embodiment of a semiconductor memory device according to the present invention.

FIG. 3 shows an embodiment of a semiconductor memory device according to the present invention.

The semiconductor memory device of the present embodiment having a plurality of read/write ports (n-read/ m-write ports) comprises m write selection switch ("SW") units (writing port selection gates) 21 to 2m and n read selection switch ("SW") units (reading port selection gates) 31 to 3n for a plurality of (k) data latch portions (memory cells) 11 to 1k.

As shown in FIG. 3, the semiconductor memory device has a first data latch portion 11 directly accessible by externally entering the address, and second data latch portions 12 to 1k provided in parallel to the first data latch portion 11. The first and second data latch portions 11 to 1k is provided with respective switching units (data latch portion selecting transfer gates) 41 to 4k and a selector 5. For each switching units 41 to 4k and selector 5, a selection signal SS is supplied to selectively access one of the first and second data latch portions 11 to 1k.

Note, in this embodiment, since one of the first and second data latch portions 11 to 1k can be selected by the selection signal SS, the content of the directly accessible memory cell which is addressed by externally entering an address, can be replaced depending upon the designation of the local register file. Namely, by assigning the local register file for respective data latch portions 11 to 1k, one of the targeted data latch portions can be exclusively selected by the switching units 41 to 4k according to the progress of the program.

Figure 4:
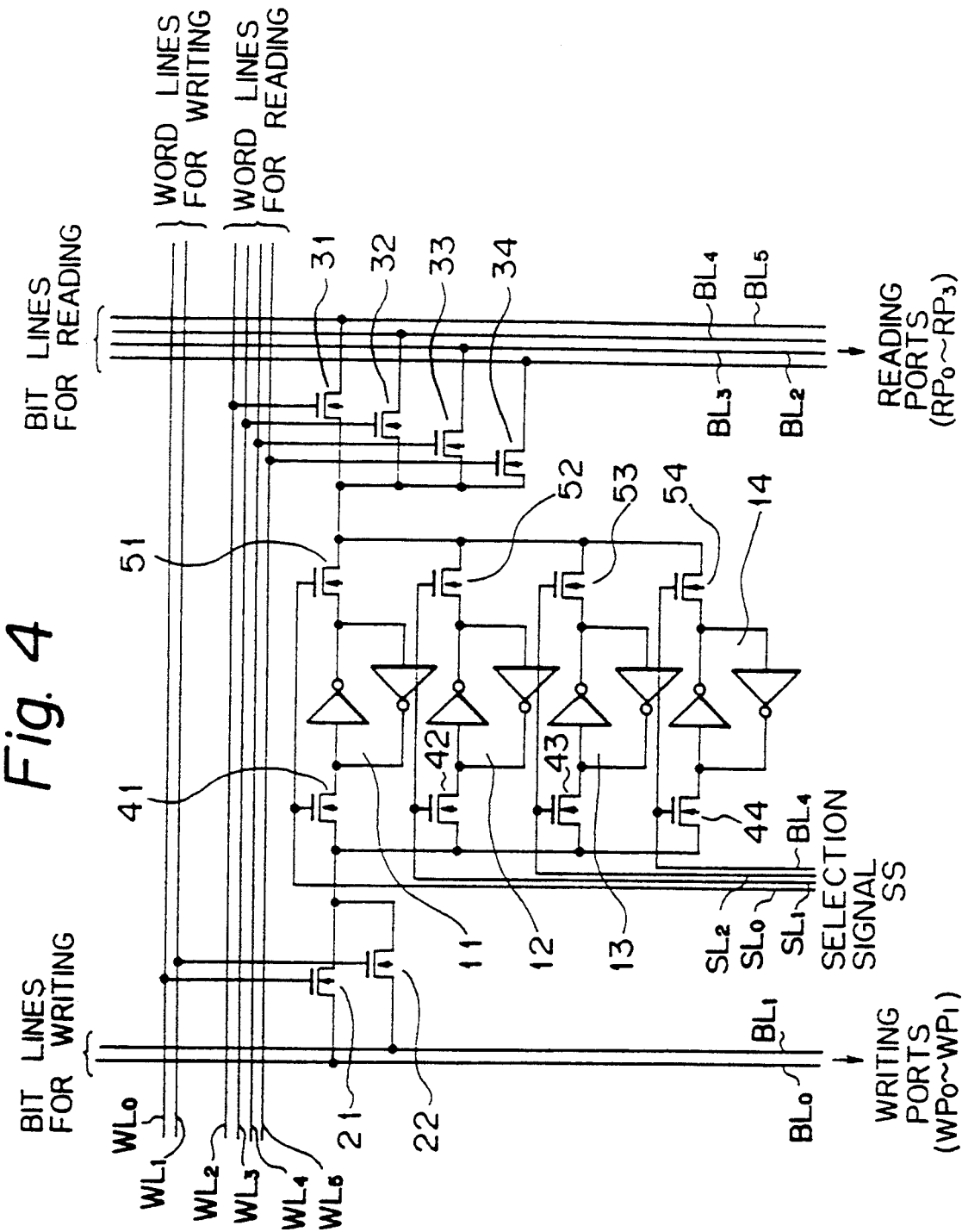
FIG. 4 is a circuit diagram of a part of a SRAM having four-read/two-write ports and to which the semiconductor memory device of FIG. 3 is applied.
Figure 5:
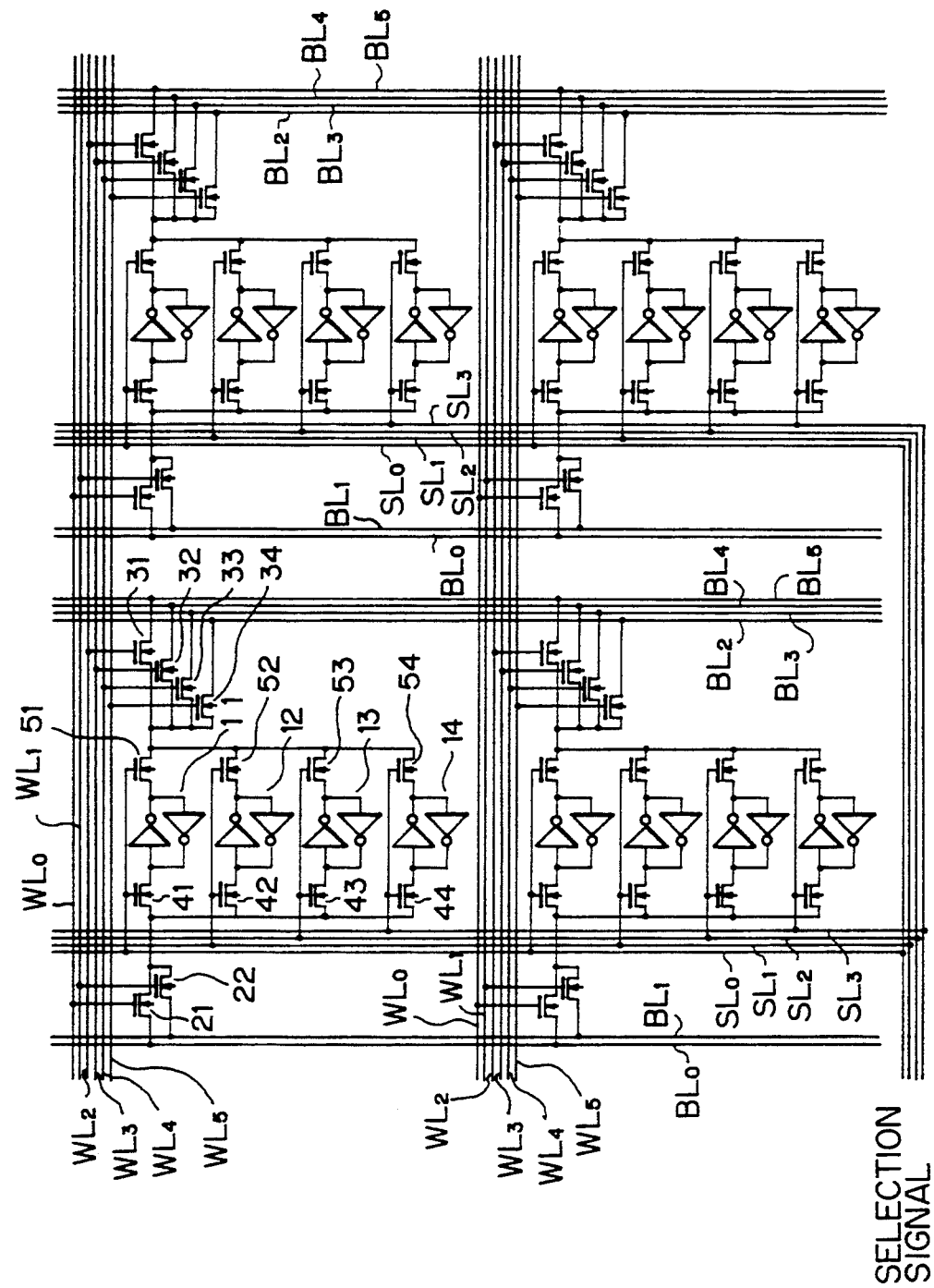
FIG. 5 is a circuit diagram showing four SRAM cells of the type of FIG. 4.

FIG. 4 shows a part of a SRAM having four-read/ two-write ports, to which the semiconductor memory device of FIG. 3 is applied, and further, FIG. 5 shows the configuration of four SRAM cells of FIG. 4.

In FIGS. 4 and 5, references $BL_0$ and $BL_1$ denote bit lines for writing (writing bit lines), $WL_0$ and $WL_1$ denote word lines for writing (writing word lines), $BL_2$ to $BL_5$ denote bit lines for reading (reading bit lines), and $WL_2$ to $WL_5$ denote word lines for reading (reading word lines).

As shown in FIG. 4, this SRAM is formed by two writing port selection gates 21, 22 and four reading port selection gates 31 to 34 for four SRAM cells 11 to 14. Namely, as shown in FIG. 4, the writing port selection gates 21 and 22 are provided for the respective intersectional portions (i.e., intersections) between each of the writing bit lines $BL_0$ and $BL_1$ and the writing word lines $WL_0$ and $WL_1$. Similarly, the reading port selection gates 31 to 34 are provided for the respective intersectional portions (i.e., intersections) between the reading bit lines $BL_2$ to $BL_5$ and the reading word lines $WL_2$ to $WL_5$. Further, the SRAM 11 to 14 are provided with respective data latch portion selecting transfer gates 41 to 44 at the writing side and respective data latch portion selecting transfer gates 51 to 54 at the reading side. These data latch portion selecting transfer gates 41 to 44 and 51 to 54 are controlled by the selection signal SS, so that one of the desired SRAM cells can be selected.

Note, the two writing ports ($WP_0$, $WP_1$) are operatively connected to the writing bit lines $BL_0$ and $BL_1$ through a sense amplifier, and the like, to write data into one of the selected SRAM cells 11 to 14. Similarly, the four reading ports ($RP_0$, $RP_1$, $RP_2$, $RP_3$) are operatively connected to the reading bit lines $BL_2$ to $BL_5$ through the sense amplifier, and the like, to read out data from one of the selected SRAM cells 11 to 14. Further, in a microprocessor including the semiconductor memory device, of the invention the writing ports $WP_0$, $WP_1$ and reading ports $RP_0$ to $RP_3$ do not comprise external ports of the microprocessor, but are connected to arithmetic operation execution units (for example, ALUs: Arithmetic and Logic Units) provided in the microprocessor thereby to internally transfer data between the arithmetic operation execution units and the semiconductor memory device (register file).

By comparing the SRAM shown in FIG. 4 with that of FIG. 2, the present embodiment of a SRAM having four-read/ two-write ports of FIG. 4 requires fourteen transistors (transfer gates 21, 22; 31, 32, 33, 34; 41, 42, 43, 44; 51, 52, 53, 54) for four memory cells (SRAM cells) 11, 12, 13 14, however, the conventional SRAM having four-read/two-write ports of FIG. 2 requires six transistors (transfer gates 321, 322; 331, 332, 333, 334) for one memory cell (SRAM cell) 311. Namely, in the present embodiment shown in FIG. 4, only 3.5 (14/4) transistors are required for one memory cell, and thus can reduce the hardware amount of the SRAM in the SRAM having the same capacity.

Figure 6:
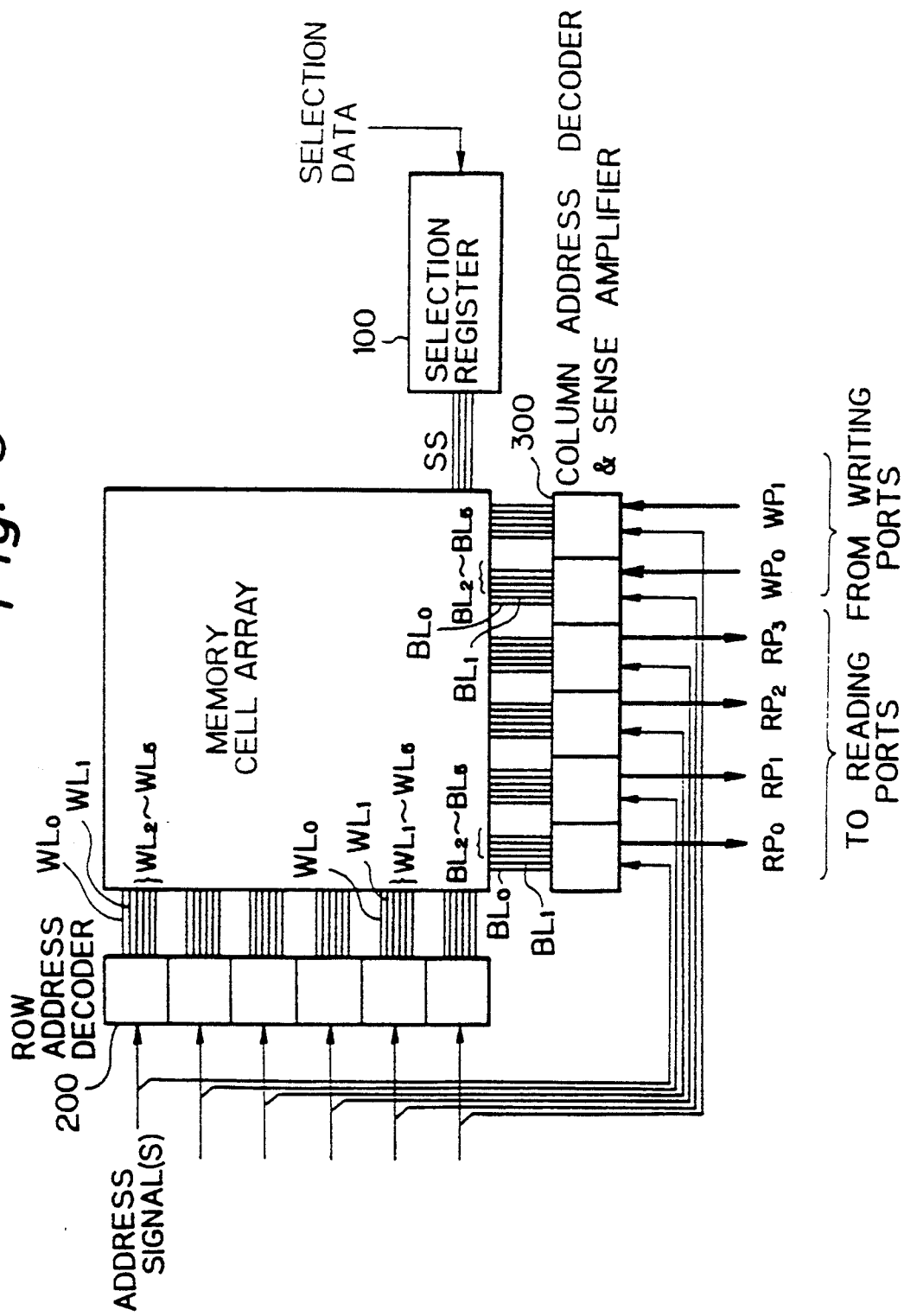
FIG. 6 is a block diagram showing a total configuration of the semiconductor memory device according to the present invention.

FIG. 6 shows a total configuration of the semiconductor memory device according to the present invention. In FIG. 6, reference numeral 100 denotes a selection register, 200 denotes a row address decoder, and 300 denotes a column address decoder and sense amplifier. As shown in FIG. 6, an address signal (address signals) is supplied to the row address decoder 200 and the column address decoder and sense amplifier 300. Note, as shown in FIG. 6, the two writing ports $WP_0$, $WP_1$ are connected to the memory cells (data latch portions) through sense amplifiers, the writing bit lines $BL_0$ and $BL_1$, and the like. Similarly, the four reading ports $RP_0$, $RP_1$, $RP_2$, $RP_3$ are connected to the memory cells through the sense amplifiers, the reading bit lines $BL_2$ to $BL_5$, and the like.

The selection register 100 receives selection data and stores the selection data in a resister provided in the selection register 100, and further the selection register 100 outputs a selection signal SS to the memory cell array. Namely, the selection signal SS is supplied to the data latch portion selecting transfer gates (41 to 4k and 51 to 54) to selectively access one of the desired first and second data latch portions (11 to 1k.)

Figure 7:
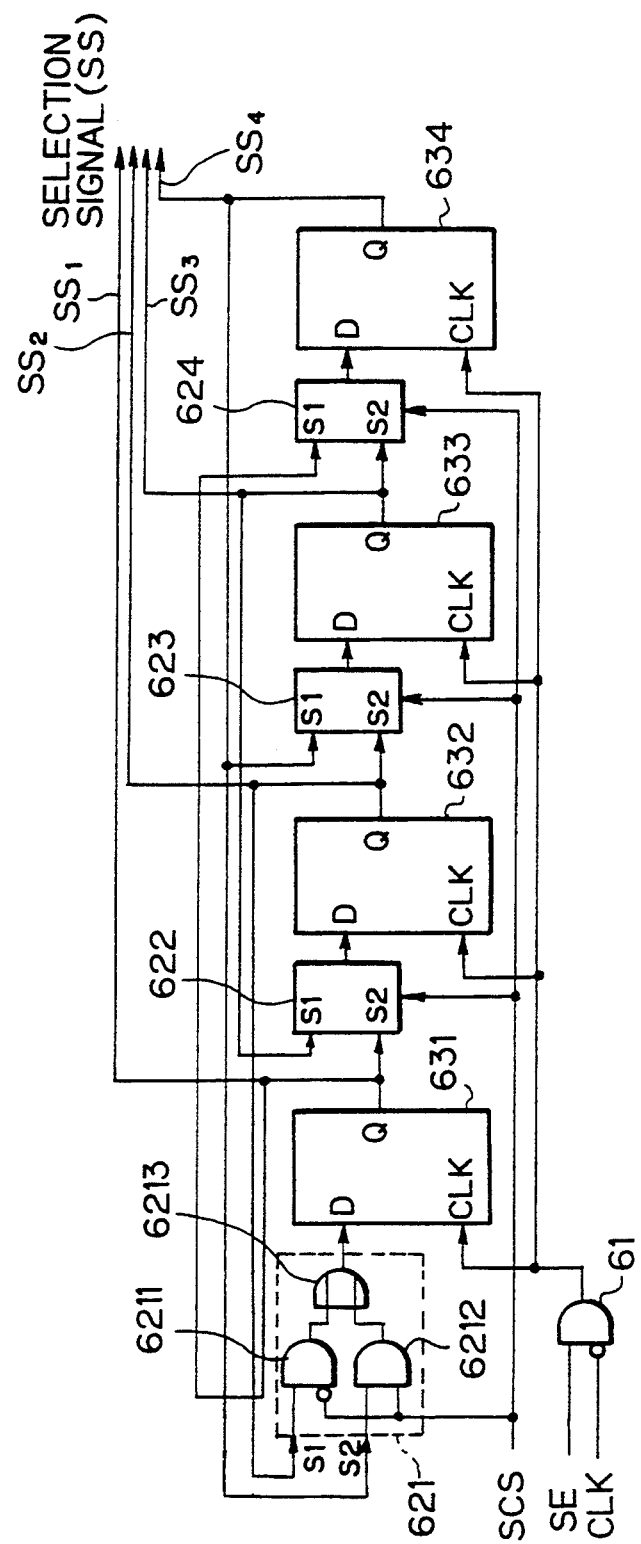
FIG. 7 is a block diagram showing an example of a selection signal generation circuit.

FIG. 7 shows an example of a selection signal generation circuit. In FIG. 7, reference numerals 621 to 624 denote selectors, 631 to 634 denote registers, and 61 denotes an AND gate.

As shown in FIG. 7, a shift enabling signal SE is supplied to one input terminal of the AND gate 61 and a clock signal CLK is inverted and supplied to another input terminal of the AND gate 61, and an output signal of the AND gate 61 is supplied to the registers 631 to 634. Further, a shift control signal SCS is supplied to the selectors 621 to 624, an output signal of each of the selectors 621 to 624 is supplied to the corresponding registers 631 to 634, and an output signal of each of the registers 631, 632, 633, 634 is supplied to the adjacent selectors 622, 623, 624, 621.

Further, as shown in FIG. 7, the selector 621 comprises two AND gates 6211 and 6212 and an OR gate 6213. In the selector 621, the output signal (Q-output signal) of the register 632 is input to one input terminal (S1) of the AND gate 6211, and the shift control signal SCS is inverted and input to another input terminal of the AND gate 6211. Similarly, the output signal (Q-output signal) of the register 634 is input to one input terminal (S2) of the AND gate 6212, and the shift control signal SCS is directly input to another input terminal of the AND gate 6212. Further, output signals of the AND gates 6211 and 6212 are input to input terminals of the OR gate 6213. Note, each of the selectors 622 to 624 has the same structure as that of the selector 621.

Note, this selection signal generation circuit of FIG. 7 is used to generate four selection signals SS ($SS_1$ to $SS_4$) for selecting the data latch portion selecting transfer gates 41 to 44 and 51 to 54 shown in FIGS. 4 and 5. Namely, for example, a first selection signal $SS_1$ is supplied to the gates of the transistors (data latch portion selecting transfer gates) 41 and 51 for a first SRAM cell (memory cell) 11, a second selection signal $SS_2$ is supplied to the gates of the transistors 42 and 52 for a second SRAM cell 12, a third selection signal $SS_3$ is supplied to the gates of the transistors 43 and 53 for a third SRAM cell 13, and a fourth selection signal $SS_4$ is supplied to the gates of the transistors 44 and 54 for a fourth SRAM cell 14.

In this case, when the shift enabling signal SE is at a high level "H", the selection signals $SS_1$ to $SS_4$ are shifted, that is the selection signals $SS_1$ to $SS_4$ are output in an orderly fashion. Namely, the SRAM cells 11 to 14 are orderly selected and accessed. Conversely, when the shift enabling signal SE is at a low level "L", the selection signals $SS_1$ to $SS_4$ are not shifted.

Note, in the case that the shift enabling signal SE is at the high level "H", and when the shift control signal SCS is at a high level "H", the selection signals $SS_1$ to $SS_4$ are shifted in clockwise rotation, so that the four SRAM cells 11 to 14 are accessed in an orderly manner. Namely, the SRAM cells 11 to 14 of FIG. 4 are selected as 11→12→13→14→11→ . . . , in accordance with the clock signal CLK. Conversely, in the case that the shift enabling signal SE is at the high level "H", and when the shift control signal SCS is at a low level "L", the SRAM cells 11 to 14 of FIG. 4 are selected as 11→14→13→12→11→ . . . , in accordance with the clock signal CLK.

Figure 8:
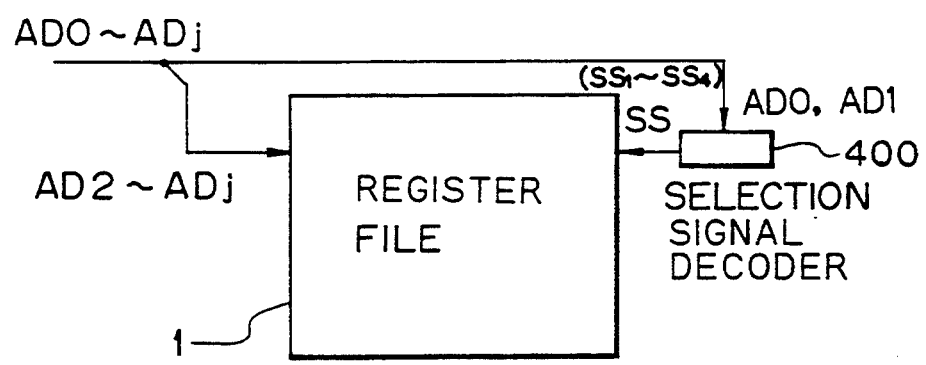
FIG. 8 is a block diagram showing another example of a selection signal generation circuit.

FIG. 8 is a block diagram showing another example of a selection signal generation circuit. In FIG. 8, a reference numeral 400 denotes a selection signal decoder. Note, the selection signal generation circuit shown in FIG. 8 generates the selection signal SS by using address signals (AD0 and AD1), however, the selection signal generation circuit shown in FIG. 7 generates the selection signal SS by using the shift enabling signal SE, the shift control signal SCS, and the clock signal CLK.

For example, as shown in FIG. 8, j-bits of the address signals AD0 to ADj supplied to the semiconductor memory device consist of first and second components AD0, AD1 and AD2 to ADj. First respective components of the address signals AD0 and AD1 (i.e., one bit of each) are used to generate the selection signal SS (for example, four selection signals $SS_1$ to $SS_4$), and the second component of the address signals AD2 to ADj, which corresponds to a normal address signal, is used to select and access a specific memory cell in the memory cell array. Namely, as shown in FIG. 8, two bits of the address signals AD0 and AD1 are supplied to a selection signal decoder 400; the address signals AD0 and AD1 are decoded by the selection signal decoder 400, and four selection signals $SS_1$ to $SS_4$ are generated and supplied to the register file 1.

FIG. 9 is a block diagram showing an example of a major part of a microprocessor employing two arithmetic operation execution units and the semiconductor memory device according to the present invention. In FIG. 9, reference numeral 1 denotes a register file (semiconductor memory device); 2 and 3 denote ALUs (arithmetic operation execution units); 100 denotes a selection register, 101 denotes an instruction decoding unit, and 102 denotes an instruction fetching unit. Note, in this example, two ALUs 2 and 3 are provided, and thus the register file 1 is constituted of a four-read/two-write memory (SRAM having four-read/two-write ports).

The microprocessor (arithmetic processing device), which is formed by one chip configuration, comprises the instruction fetching unit 102, the instruction decoding unit 101, the register file 1, and two ALUs 2, 3. The instruction fetching unit 102 is used to fetch an instruction, and the instruction decoding unit 101 is used to decode the instruction fetched by the instruction fetching unit 102. The register file 1 is used to store data, and the ALUs are used to carry out parallel arithmetic operations. Note, as described above, the register file (semiconductor memory device) 1 includes a plurality of data latch portions 11 to 14, and selectors 51 to 54 (corresponding to selector 5).

As shown in FIG. 9, the ALU 2 is connected to the register file 1 by one writing port $WP_0$ (writing bit line $BL_0$) and two reading ports $RP_0$ and $RP_1$ (reading bit lines $BL_2$ and $BL_3$), and similarly, the ALU 3 is connected to the register file 1 by one writing port $WP_1$ (writing bit line $BL_1$) and two reading ports $RP_2$ and $RP_3$ (reading bit lines $BL_4$ and $BL_5$). Namely, two data are read out from the register file 1 to the ALU 2, and another two data are read out from the register file 1 to the ALU 3 at the same time. Further, the results of an arithmetic operation of the ALUs 2 and 3 are again stored in the register file 1. Therefore, two arithmetic operations can be carried out by two ALUs 2 and 3 in parallel formation.

FIG. 10 shows another embodiment of the semiconductor memory device according to the present invention. Note, in the embodiment shown in FIG. 3, a plurality of data latch portions 11 to 1k are parallel connected and one of the data latch portions 11 to 1k is randomly selected by the selection signal SS. In contrast, in this embodiment of FIG. 10, a first data latch portion 111 directly accessible by externally entering an address and a plurality of second data latch portions 112 to 11k, provided in parallel relative to the first data latch portion 111 are directly connected by a communication unit (not shown) so that one of the first and second data latch portions 111 to 11k can be accessed by shifting the data in a specified order (for example, clockwise shifting) with a clock signal CLK. Namely, for example, when data stored in the data latch portion 113 are read out, the data stored in the data latch portion 113 is shifted to the data latch portion 111 through the data latch portion 112 employing two cycles of a clock signal CLK, and then the data shifted to the data latch portion 111 is read out. Note, for example, when writing specific data into the data latch portion 113 after writing the specific data at the data latch portion 111, the data is shifted to the data latch portion 113 in accordance with the clock signal CLK. Further, the second data latch portions may be defined as the (k-1) portions (112 to 11k) or may be determined or defined, instead to be only one portion (e.g., 112).

In the above description, the data shift of the clockwise rotation denotes that data stored (latched) in the first SRAM cell 111 is transferred to the second SRAM cell 112, or data stored in the third SRAM cell 113 is transferred to the fourth SRAM cell 114, in response to one (i.e., a single) clock signal CLK.

Figure 11A:
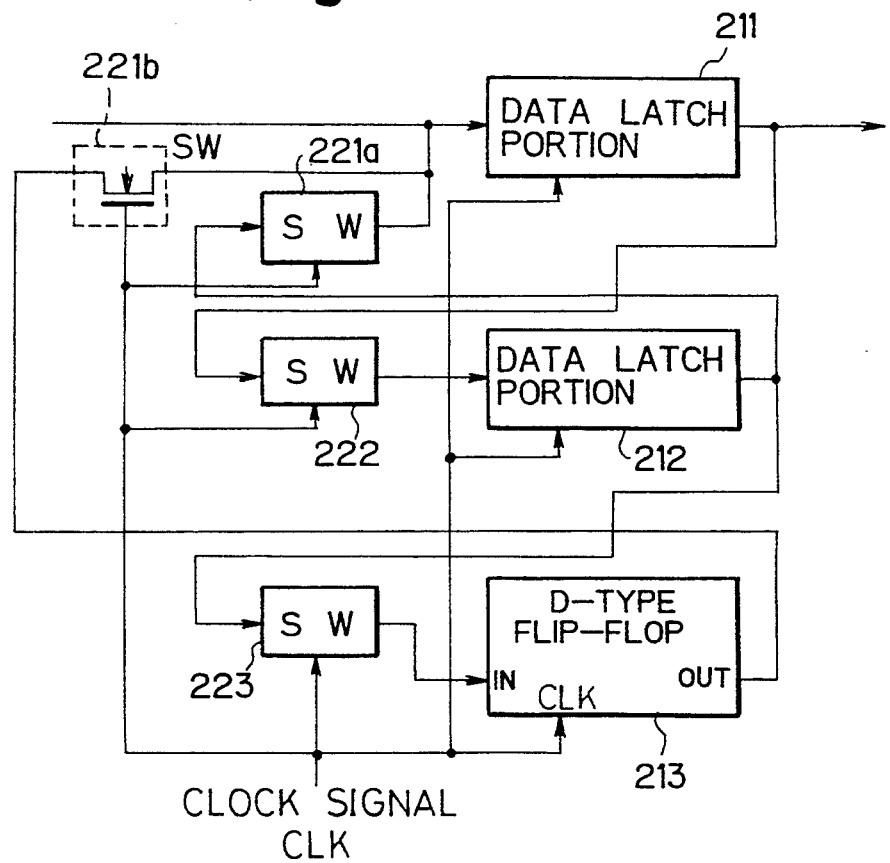
FIGS. 11A and 11B are block diagrams showing a practical embodiment of the semiconductor memory device of FIG. 10.
Figure 11B:
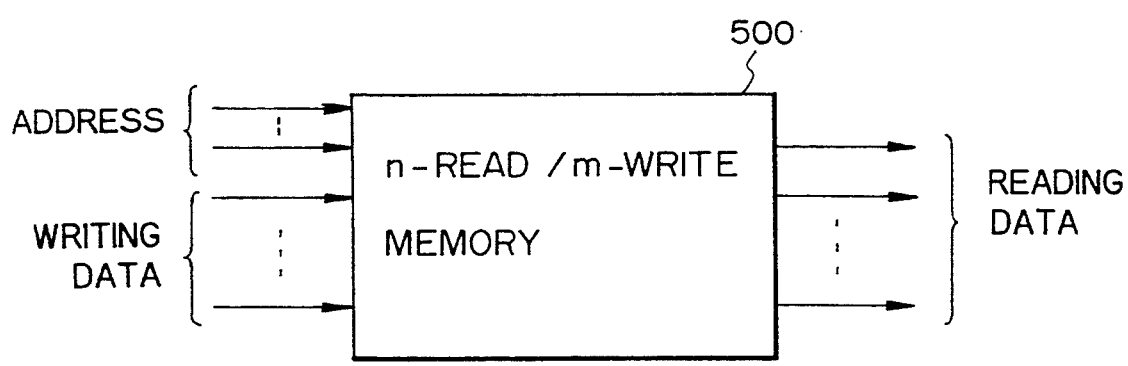

FIGS. 11A and 11B show a practical embodiment of the semiconductor memory device of FIG. 10.

As shown in FIG. 11A, in the semiconductor memory device having a plurality of read/write ports (n-read/m-write ports), two data latch portions 212 and 213 are provided for one data latch portion (memory cell 211), and switching units (shifting control transfer gate) 221a, 221b, 222 and 223 are provided for directly connecting the data latch portions 211, 212 and 213. Note, as shown in FIG. 11A, each of the switching units 221a, 221b, 222 and 223, for example, comprises an N-type MOS transistor, and each of the data latch portions 211, 212 and 213, for example, comprises a D-type flip-flop.

Note, in this embodiment of FIGS. 11A and 11B, the data stored in the data latch portions 211, 212 and 213 are adapted to be both clockwise and counterclockwise shifted. Further, in this embodiment, three bit memory cells (data latch portion) are provided, and it may be possible to shift the data by providing memory cells having k bits, as required. Furthermore, the signal (i.e., a control signal) to control the shifting of data is not limited to use of the clock signal CLK supplied from the external portion of the semiconductor memory device and instead another control signal may be used.

As shown in FIG. 11B, the register file is formed with only an n-read/m-write×k memory 500 having k number of memory cells. Namely, by applying this embodiment of FIGS. 11A and 11B, the semiconductor memory device (n-read/m-write memory 301 to 30k) having the same capacity as that of FIGS. 1A and 1B can comprises only the n-read/m-write×k memory 500, so that the hardware amount can be significantly reduced. Note, the semiconductor memory device can be separated into a memory cell array portion and a peripheral portion (decoder, buffer, selector, sense amplifier, and the like). However, by applying the present invention, when an increase of the number (k) of the local register files is desired, only the memory array depends on the number of the local register files, and an increase of the hardware amount relative to the number of the local register files can be made smaller than that in the prior art (for example, less than or equal to 50% of the amount of hardware in the prior art).

Consequently, according to the semiconductor memory device shown in FIGS. 11A and 11B, the amount of hardware of the register file of the microprocessor employing a parallel processing and local register architecture can be reduced. In particular, when a plurality of local register files is provided, the hardware amount can be reduced significantly.

As described above, according to the semiconductor memory device of the present invention, the hardware amount of the register file of the microprocessor employing parallel processing and local register architecture can be significantly reduced by providing the first data latch portion and at least one or more of the second data latch portions having a communication unit and accessing one of the desired first and second data latch portions.

Many widely differing embodiments of the present invention may be constructed without departing from the spirit and scope of the present invention, and it should be understood that the present invention is not limited to the specific embodiments described in this specification, except as defined in the appended claims.

I claim:

1. A semiconductor memory device comprising:
   a plurality of writing ports add a plurality of reading ports for respectively carrying out parallel writing and parallel reading operations therethrough;
   a first data latch portion directly accessible by externally entering an address signal;
   at least one second data latch portion connected in parallel with said first data latch portion;
   communication means for selectively accessing one of said first and second data latch portions;
   writing control transfer gates operatively connecting said writing ports to said first and second data latch portions; and
   reading control transfer gates operatively connecting said reading ports to said first and second data latch portions.

2. A semiconductor memory device as claimed in claim 1, wherein said communication means further comprises:
   plural data latch portion selecting transfer gates, respectively provided at the writing input side and the reading output side relative to said parallel connected first and second data latch portions, operative in accordance with an input selection signal for selecting one of said first and second data latch portions.

3. A semiconductor memory device as claimed in claim 2, further comprising a selection register which generates said selection signal.

4. A semiconductor memory device as claimed in claim 2, further comprising a selection signal decoder which receives a part of the address signal and in response thereto generates the selection signal.

5. A semiconductor memory device comprising:
   a plurality of writing ports and a plurality of reading ports for respectively carrying out parallel writing and parallel reading operations therethrough;
   a first data latch portion directly accessible by externally entering an address signal;
   at least one second data latch portion connected in parallel with said first data latch portion;
   communication means for selectively accessing one of said first and second data latch portions;
   writing control transfer gates operatively connecting said writing ports to said first data latch portion; and
   reading control transfer gates operatively connecting said reading ports to said first data latch portion.

6. An arithmetic processing device having a one chip configuration including an instruction fetching unit for fetching an instruction, an instruction decoding unit for decoding said instruction fetched by said instruction fetching unit, a plurality of arithmetic operation executing units for performing parallel arithmetic operations, and a register file for storing data, the register file having a plurality of writing ports and reading ports respectively carrying out parallel writing and parallel reading operations therethrough, said register file comprising:
- a first data latch portion directly accessible by externally entering an address signal;
- at least one second data latch portion connected in parallel to said first data latch portion;
- communication means for selectively accessing one of first and second data latch portions;
- writing control transfer gates operatively connecting said writing ports to said first and second data latch portions; and
- reading control transfer gates operatively connecting said reading ports to said first and second data latch portions.

7. A semiconductor memory device as claimed in claim 6, wherein said communication means further comprises:
- plural data latch portion selecting transfer gates, respectively provided at the writing input side and the reading output side relative to said parallel connected first and second data latch portions, operative in accordance with an input selection signal for selecting one of said first and second data latch portions.

8. A semiconductor memory device as claimed in claim 7, further comprising a selection register which generates said selection signal.

9. A semiconductor memory device as claimed in claim 7, further comprising a selection signal decoder which receives a part of the address signal and in response thereto generates the selection signal.

10. An arithmetic processing device having a one chip configuration including an instruction fetching unit for fetching an instruction, an instruction decoding unit for decoding said instruction fetched by said instruction fetching unit, a plurality of arithmetic operation executing units for performing parallel arithmetic operations, and a register file for storing data, the register file having a plurality of writing ports and reading ports respectively carrying out parallel writing and parallel reading operations therethrough, said register file comprising:
- a first data latch portion directly accessible by externally entering an address signal;
- at least one second data latch portion connected in parallel to said first data latch portion;
- communication means for selectively accessing one of first and second data latch portions;
- writing control transfer gates operatively connecting said writing ports to said first data latch portion; and
- reading control transfer gates operatively connecting said reading ports to said first data latch portion.

11. A semiconductor memory device as claimed in claim 1, wherein said selection signal is generated by using a selection signal decoder receiving a part of said address signal.

12. A semiconductor memory device as claimed in claim 1, wherein data writing data are transferred from said writing ports to one of said first and second data latch portions through a plurality of bit lines for writing, and reading data are transferred from one of said first and second data latch portions to said reading ports through a plurality of bit lines for reading.

13. A semiconductor memory device as claimed in claim 12, wherein the connection between said bit lines for writing and said first and second data latch portions are controlled by a plurality of writing port selection gates, and the connection between said first and second data latch portions and said bit lines for reading are controlled by a plurality of reading port selection gates.

14. A semiconductor memory device as claimed in claim 5, wherein said communication means comprises a plurality of shifting control transfer gates for shifting data of one of said second data latch portions to said first data latch portion and for accessing one of said first and second data latch portions in accordance with a control signal.

15. A semiconductor memory device as claimed in claim 14, wherein said control signal is an externally supplied clock signal.

16. A semiconductor memory device as claimed in claim 5, wherein writing data are written from said writing ports into said first data latch portion through a plurality of bit lines for writing, reading data are read out from said first latch portion to reading ports through a plurality of bit lines for reading, and the data stored in said first data latch portion are shifted to said second data latch portions.

17. A semiconductor memory device as claimed in claim 16, wherein the connection between said bit lines for writing and said first data latch portions are controlled by a plurality of writing port selection gates, and the connection between said first data latch portions and said bit lines for reading are controlled by a plurality of reading port selection gates.

18. An arithmetic processing device as claimed in claim 6, wherein writing data are transferred from said writing ports to one of said first and second data latch portions through a plurality of bit lines for writing, and reading data are transferred from one of said first and second data latch portions to said reading ports through a plurality of bit lines for reading.

19. An arithmetic processing device as claimed in claim 18, wherein the connection between said bit lines for writing and said first and second data latch portions are controlled by a plurality of writing port selection gates, and the connection between said first and second data latch portions and said bit lines for reading are controlled by a plurality of reading port selection gates.

20. An arithmetic processing device as claimed in claim 10, wherein said communication means comprises a plurality of shifting control transfer gates for shifting data of one of said second data latch portions to said first data latch portion and for accessing one of said first and second data latch portions in accordance with a control signal.

21. An arithmetic processing device as claimed in claim 20, wherein said control signal is an externally supplied clock signal.

22. An arithmetic processing device as claimed in claim 10, wherein writing data are written from said writing ports into said first data latch portion through a plurality of bit lines for writing, reading data are read out from said first latch portion to reading ports through a plurality of bit lines for reading, and the data stored in said first data latch portion are shifted to said second data latch portions.

23. An arithmetic processing device as claimed in claim 22, wherein the connection between said bit lines for writing and said first data latch portions are controlled by a plurality of writing port selection gates, and the connection between said first data latch portions and said bit lines for reading are controlled by a plurality of reading port selection gates.

* * * * *

UNITED STATES PATENT AND TRADEMARK OFFICE
CERTIFICATE OF CORRECTION

PATENT NO. : 5,355,335
DATED : October 11, 1994
INVENTOR(S) : KATSUNO

It is certified that error appears in the above-indentified patent and that said Letters Patent is hereby corrected as shown below:

Col. 3, line 64, change "each" to --a respective one--.

Col. 4, line 3, change "as" to --of--.

Col. 6, line 14, after "device" delete "," and after "invention" insert --,--.

Col. 8, line 58, after "111" insert --,--;
line 59, after "address" insert --,--.

Col. 9, line 58, after "amount" insert --,--;
line 59, after "files" insert --,--.

Signed and Sealed this

Twenty-seventh Day of December, 1994

Attest:

BRUCE LEHMAN

*Attesting Officer*     *Commissioner of Patents and Trademarks*